(12) United States Patent
Weling et al.

(10) Patent No.: US 8,679,981 B1
(45) Date of Patent: *Mar. 25, 2014

(54) METHOD FOR SELF-ALIGNED DOUBLED PATTERNING LITHOGRAPHY

(75) Inventors: Milind Weling, Pleasanton, CA (US); Judy Huckabay, Fremont, CA (US); Abdurrahman Sezginer, Monte Sereno, CA (US)

(73) Assignee: Cadence Design Systems, Inc., San Jose, CA (US)

(*) Notice: Subject to any disclaimer, the term of this patent is extended or adjusted under 35 U.S.C. 154(b) by 353 days.

This patent is subject to a terminal disclaimer.

(21) Appl. No.: 12/943,808

(22) Filed: Nov. 10, 2010

Related U.S. Application Data

(62) Division of application No. 12/264,853, filed on Nov. 4, 2008, now Pat. No. 7,856,613.

(60) Provisional application No. 61/024,849, filed on Jan. 30, 2008.

(51) Int. Cl.
*H01L 21/302* (2006.01)

(52) U.S. Cl.
USPC ............ 438/694; 438/696; 438/706; 430/313

(58) Field of Classification Search
USPC .............................. 438/694, 696, 706; 430/313
See application file for complete search history.

(56) References Cited

U.S. PATENT DOCUMENTS

| | | | |
|---|---|---|---|
| 7,174,520 B2 | 2/2007 | White et al. | |
| 7,341,952 B2 | 3/2008 | Tzou et al. | |
| 2003/0230234 A1* | 12/2003 | Nam et al. | 117/97 |
| 2006/0253828 A1 | 11/2006 | Rankin et al. | |
| 2007/0190728 A1 | 8/2007 | Sreekantham et al. | |
| 2007/0205443 A1 | 9/2007 | Juengling | |
| 2007/0238308 A1 | 10/2007 | Niroomand et al. | |
| 2007/0249174 A1* | 10/2007 | Yang | 438/712 |
| 2008/0216027 A1 | 9/2008 | White et al. | |
| 2009/0031261 A1 | 1/2009 | Smith et al. | |
| 2009/0108313 A1 | 4/2009 | Doyle et al. | |
| 2009/0146322 A1* | 6/2009 | Weling et al. | 257/786 |
| 2010/0259738 A1 | 10/2010 | Dowski et al. | |

OTHER PUBLICATIONS

Bencher, Chris, SADP: The Best Option for <32nm NAND Flash, Nanochip Technology Journal, Issue Two 2007, pp. 8-13.
www.dictionary.com—definition of "contiguous".

* cited by examiner

*Primary Examiner* — Shamim Ahmed
(74) *Attorney, Agent, or Firm* — Kenyon & Kenyon LLP

(57) ABSTRACT

Various embodiments of the invention provide systems and methods for semiconductor device fabrication and generation of photomasks for patterning a target layout of line features and large features. Embodiments of the invention are directed towards systems and methods using self-aligned double pattern to define the target layout of line features and large features.

10 Claims, 13 Drawing Sheets

METHOD FOR SELF-ALIGNED DOUBLED PATTERNING LITHOGRAPHY

CROSS REFERENCE TO RELATED APPLICATION

This application is a divisional of and claims the benefit of U.S. patent application Ser. No. 12/264,853, filed Nov. 4, 2008, now issued as U.S. Pat. No. 7,856,613, entitled "METHOD FOR SELF-ALIGNED DOUBLED PATTERNING LITHOGRAPHY," which claims priority from U.S. Provisional Application Ser. No. 61/024,849, filed on Jan. 30, 2008, each of which is hereby incorporated herein by reference in its entirety.

TECHNICAL FIELD

The present invention relates to designing and manufacturing devices, and more particularly, some embodiments relate to the design and fabrication of semiconductor devices using double patterning.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages through which the designer creates an integrated circuit by hierarchically defining functional components of the circuit. From this high-level functional description, a physical circuit implementation dataset is created, which is usually in the form of a netlist. This netlist identifies logic cell instances from a target standard cell library, and describes cell-to-cell connectivity.

A layout file is then created using the netlist. This is accomplished through a layout and routing process, which assigns logic cells to physical locations in the device layout and routes their interconnections. This layout can be transferred or applied to the semiconductor substrate in a series of layers that collectively form the devices that make up the components of the integrated circuit. A process by which such layers are patterned on the substrate is known as photolithography. During photolithography, a series of photomasks created from the layout file are used to transfer the layout onto the substrate layer by layer. A photomask, or mask, provides an image of the physical geometries of its respective integrated circuit layer. Passing light through transparent sections defined by the mask elements transfers the layout pattern for the layer onto the wafer. An imaging lens system projects and focuses the layout onto the substrate at the desired size. The projected light pattern interacts with a photosensitive coating on the wafer and, depending on the coating used, it is cured or rendered susceptible to removal in the areas that were exposed to the light. Accordingly, the projection of the mask pattern onto the coating can be used to transfer the pattern to the wafer.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is limited by the wavelength of the light used, and the ability of the lens system to capture enough diffraction orders from the illuminated mask. The minimum feature size that a projection system can print can be approximated by:

$$F = k1 * \lambda / N_A$$

where F is the minimum feature size, k1 is a coefficient of process-related factors, $\lambda$ is the wavelength of light used and $N_A$ is the numerical aperture of the lens as seen from the wafer. With lithography processes using deep ultraviolet light with wavelengths of 248 to 193 nm, minimum feature sizes of approximately 50 nm can be achieved. Accordingly, the resolution limit of conventional lithography technology is increasingly being challenged by the shrinking dimensions of critical IC feature geometries.

Not only are the critical feature geometries decreasing in accordance with, or even faster than, Moore's Law predictions, the already large number of these feature geometries is growing at a dramatic rate as well. Furthermore, due to process enhancements such as optical proximity correction, the overall polygon count is increasing as well. With lithography technology at wavelengths of 193 nm, optical characteristics of the light are affecting the ability to decrease feature sizes.

One class of technologies used to enhance feature density is referred to as double patterning or multiple patterning. There are several types of double patterning in use, the four most common being: double exposure, spacer mask, heterogeneous mask, and intermediate pattern accumulation. FIG. 1 is a diagram illustrating one example of spacer or self-aligned double patterning. Referring now to FIG. 1, in the first part of the process 100, a sacrificial layer 10, which is typically made of poly-silicon, is deposited and then patterned using photolithography. Sacrificial layer 10 is deposited over a substrate comprising one or more hard mask layers 15, which are deposited over the actual layer 20 that is to be patterned.

As illustrated at 101, a spacer material 25 such as, for example, silicon nitride, silicon oxide, or silicon oxynitride is deposited. Also illustrated at 101 is the patterning of a photoresist layer 30 to protect the spacer material in selected locations. Accordingly, another mask layer is used to pattern photoresist 30. As illustrated at 102, spacer material 25 is etched anisotropically, preferentially removing the spacer material on the horizontal surfaces. As a result, the structure illustrated in 103 remains after sacrificial layer 10 is etched away. This structure includes spacer material 35 and 40, which forms a spacer pattern. A subsequent etch process removes the exposed hardmask, transferring the spacer pattern formed by spacer material 35, 40 to underlying layer 20 as illustrated at 104. As an alternative to using photoresist layer 30 to protect spacer material in selected location 40 in order to protect hardmask 15, a photoresist layer could be patterned at 103 to achieve the same result.

FIG. 2 is a diagram illustrating a top view of an example of patterning created with the example process described in FIG. 1 and masks used to make the illustrated features. Referring now to FIGS. 1 and 2, FIG. 2 shows patterns 12 created by sacrificial layer 10 and Mask A; patterns 14 created by spacer 35 after spacer etch; and components of logic devices 16 created by feature Mask B. With reference to FIG. 1, it is noted that mask B corresponds to patterning of photoresist 30.

As FIG. 2 illustrates, once the polysilicon lines 12 are removed, spacer lines 14 remain and the density is approximately doubled. To remove the short 50 between each pair of spacer lines 14, a third mask layer ask C is used to remove the unwanted parts of spacer as illustrated by dashed lines 45. As the examples provided in FIGS. 1 and 2 illustrate, for each feature line 12 of sacrificial layer 10, the process yields two lines 14, thereby doubling the density.

As these examples also illustrate, conventional techniques using self-aligned double patterning processes are useful for making lines but have not been used to make arbitrary patterns. For example, in the instance of logic circuits, conventional techniques do not utilize self-aligned double patterning in forming logic patterns having line features in conjunction with large features, such as pad features, connection features, and logic devices. According to conventional wisdom, self-aligned double patterning is useful only in forming a dense array of line features, such as those used in memory circuits.

BRIEF SUMMARY OF EMBODIMENTS OF THE INVENTION

In accordance with various embodiments of the invention, systems and methods relating to patterning a target layout of line features and large features using self-aligned double patterning are provided. According to one embodiment of the invention, the method of semiconductor device fabrication for patterning a target layout of line features and large features begins by depositing a first layer of a first material and patterning the first layer to form a first pattern on a substrate. The first pattern comprises a first array of line features. Next, spacer material is deposited over the first pattern, followed by a spacer-etch process that removes spacer material from horizontal surfaces of the substrate and the first pattern, yet leaves spacer material adjacent to vertical surfaces of the first pattern. Subsequently, the first pattern is removed from the substrate, leaving behind the spacer material remaining after the spacer-etch process. Following selective removal of the remaining spacer material, the spacer material forms a spacer material pattern comprising the line features of the target layout. After, a second layer of second material is deposited and patterned over the spacer material pattern, thereby forming a second pattern. The second pattern comprises the large features of the target layout.

According to some embodiments, the density of line features within the target layout is double that of the line features within the first array. In yet further embodiments, the first layer and second layer combined form a gate layer of a circuit design.

In some embodiments, the line features of the target layout have a width narrower than a minimum critical dimension, which is typically the smallest dimension that can be reliably produced with an available photolithographic patterning process. Additionally, in further embodiments, the large features of the target layout have a width larger than the minimum critical dimension. The large features of the target layout include, but are not limited to, connection features, contact pad features, and logic devices.

In further embodiments, depositing and patterning of the second layer occurs after spacer material deposition but before the spacer-etch process. Alternatively, in other embodiments, depositing and patterning of the second layer occurs after the removal of the first pattern from the substrate.

In various embodiments, the selective removal of the spacer material involves using a photomask to remove certain portions of the spacer material. In further embodiments, patterning the first layer and the second layer involves using a photomask.

Some embodiments of the invention provide a method of producing a dataset for creating a photomask set used in patterning a target layout of line features and large features in a circuit design. The method begins by receiving a layout dataset representing features of the circuit design. From the layout dataset, the method derives a first dataset that represents line features, and a second dataset that represents large features. Next, the method generates a first mask dataset from the first dataset, wherein the first mask dataset represents a first pattern comprising a first array of line features. The first array of line features, in turn, defines a second array of line features when subsequent to a spacer-etch process spacer material remains adjacent vertical surfaces of the first array of lines. The spacer material that remains forms the second array.

The method then generates a second mask dataset from the first dataset, wherein the second mask dataset represents portions of the second array of line features to be selectively removed. Upon removal, the portions that remain form the line features of the target layout. After, the method generates a third mask dataset from the second dataset, wherein the third mask dataset represents a second pattern comprising the large features of the target layout.

In further embodiments of the invention, a computer program product is provided, having computer program code, enabling a computing device to generate dataset for photomasks used in patterning a target layout of line features and large features in a circuit design.

In yet further embodiments, a computer aided design tool is provided, comprising a processor, memory coupled to the processor and having computer program code enabling the processor to perform operations in accordance with methods of the invention.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

DETAILED DESCRIPTION OF THE EMBODIMENTS OF THE INVENTION

Various embodiments of the invention provide systems and methods for semiconductor device fabrication and generation of photomasks for patterning a target layout of line features and large features. Embodiments of the invention are directed toward systems and methods using self-aligned double pattern to define the target layout of line features and large features. As noted previously, according to conventional practices, self-aligned double patterning is used to make dense arrays of lines, such as those found in memory circuits. However, it has not been used to make arbitrary patterns, such as those found in logic circuits. Typically, the arbitrary patterns are useful in forming logic circuit patterns comprising line features and large features. Examples of large features include, but are not limited to, pad features, connection features (e.g. gate interconnect features), and logic devices. Example environments in which an embodiment of the invention can be utilized include, but are not limited to, a circuit design environment and photolithographic fabrication environment utilizing double patterning.

Figure 3:
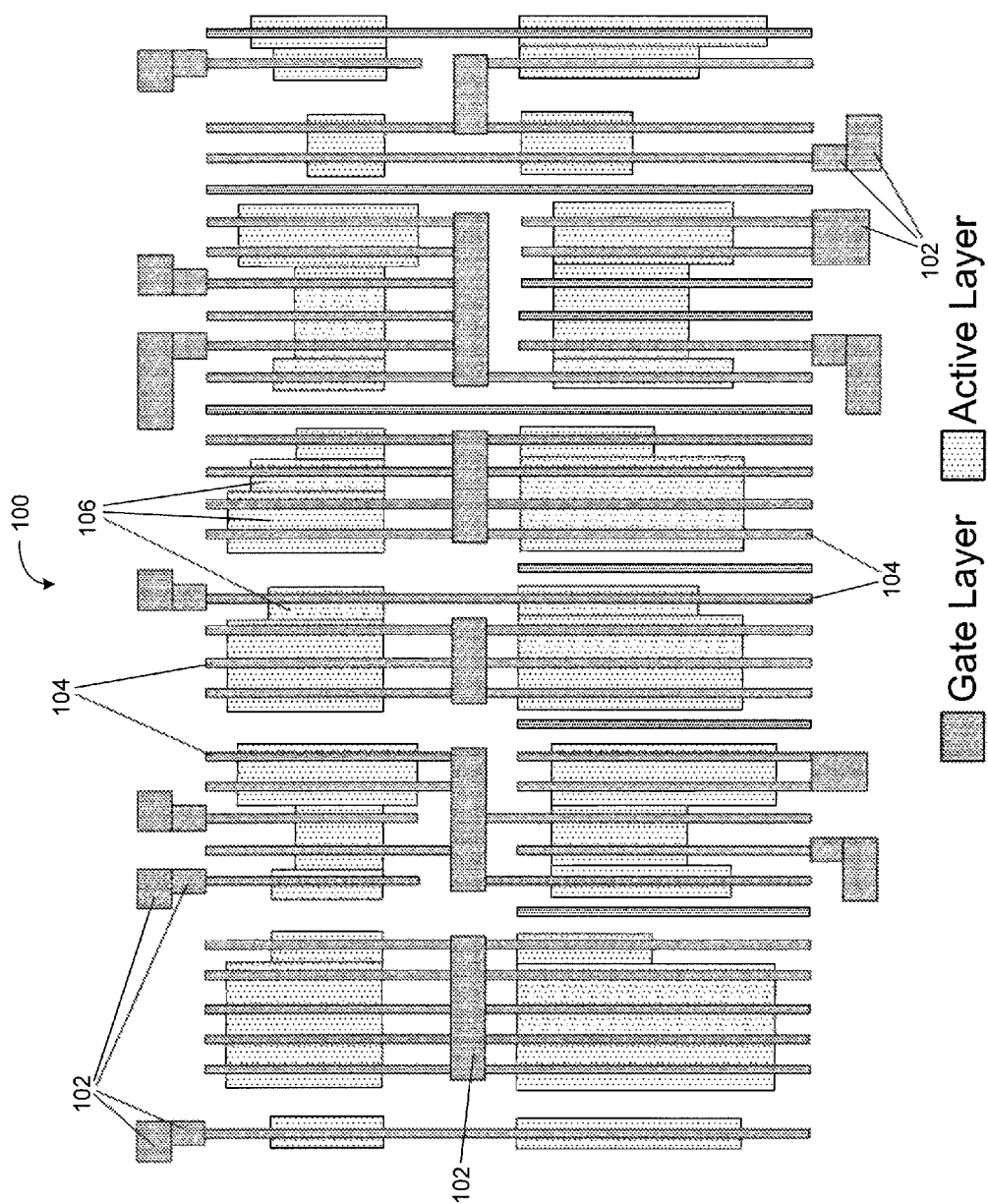
FIG. 3 is a diagram illustrating an example layout for a circuit design comprising a gate layer and an active layer.

FIG. 3 is a diagram illustrating an example layout 100 for a circuit design comprising a gate layer and an active layer. The gate layer, comprising line features 104 and large features 102, is an example of a target layout that can be patterned using an embodiment of the invention. The active layer in this example includes active regions 106 of the semiconductor material. The active layer can be formed from a p-type or n-type semiconductor material and can include doped regions. Those of ordinary skill in the art would recognize that a gate layer and an active layer are common components of an integrated circuit and understand their respective functions.

Figure 4:
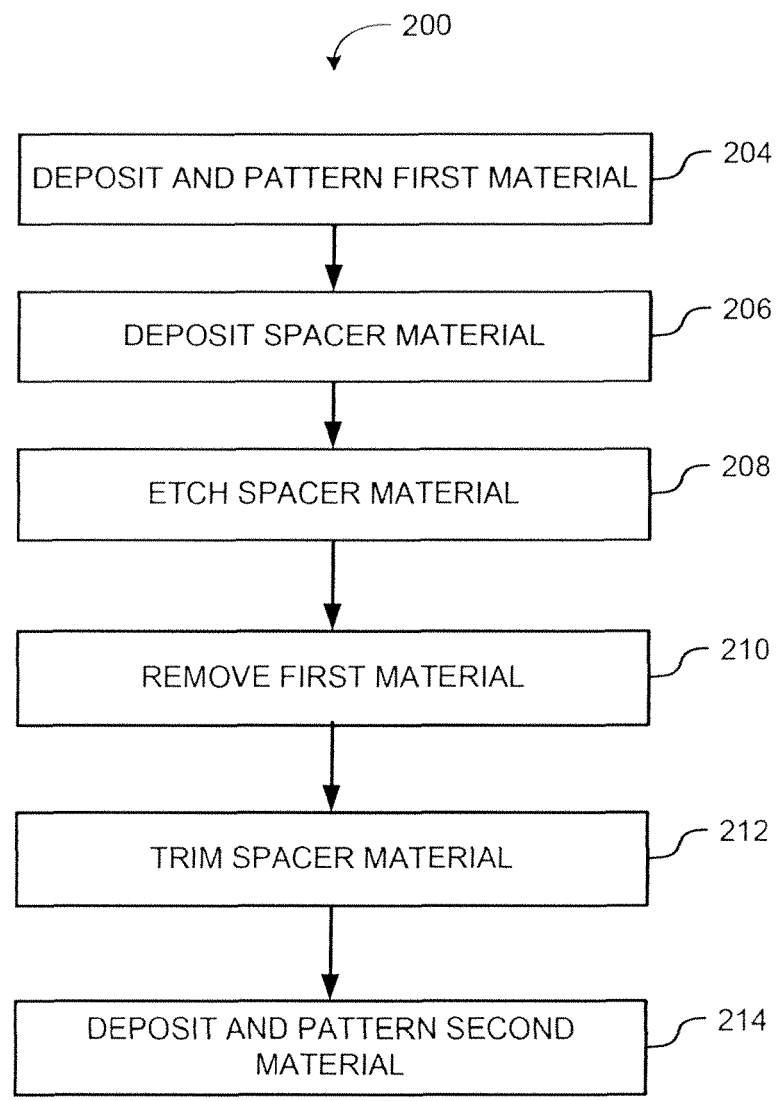
FIG. 4 is an operational flow diagram illustrating an example method for patterning in accordance with one embodiment of the invention.

Before providing an example patterning of a target layout, it is useful to describe example methods for patterning a target layout and for generating a dataset that can be used to form a set of photomasks in accordance with one embodiment of the invention. FIG. 4 is an operational flow diagram illustrating an example method 200 for patterning an intended target layout of line features and large features in accordance with one embodiment of the invention. Referring now to FIG. 4, the method 200 commences at operation 204 by depositing and patterning a first material onto a substrate. Generally, the base substrate is a semiconductor substrate (e.g. a silicon wafer) and the first material comprises polysilicon. However, one of ordinary skill in the art will understand that other materials can be used. A photolithographic operation is performed on the sacrificial layer to form a first pattern. For example, masks and resist layers can be used to pattern the sacrificial layer to form the first pattern. In some instances, this first pattern comprises a first array of lines features. As described below, this example process 200 uses this first array of line features in forming sidewall spacer features in accordance with the invention.

At operation 206, spacer material is deposited over the first pattern and the underlying substrate. Typically, the type of spacer material used includes, but is not limited to, silicon nitride, silicon oxide, and silicon oxynitride. After the spacer material deposition, a spacer-etch process is performed at operation 208 to remove spacer material from the surfaces of both the first pattern and the substrate. Within some embodiments, the spacer material is etched anisotropically during the spacer-etch process. As a result, the spacer-etch process removes spacer material from horizontal surfaces of the first pattern and the substrate, but retains spacer material adjacent the vertical surfaces of the first pattern.

Upon removal of the first pattern (i.e. sacrificial layer) at operation 210, what remains is the spacer material retained due to the vertical surfaces of the first pattern, also known as the sidewalls of the first pattern. This remaining spacer material forms a second array of line features. These features formed by the reaming spacer material are often referred to as sidewall spacer features. Typically, the resulting sidewall spacer features have a width smaller than the minimum critical dimension that can be reliably produced with an available photolithographic patterning process. Operation 212 selectively removes portions the second array line features in order to form the line features of the intended target layout (e.g. line features 104).

Figure 1:
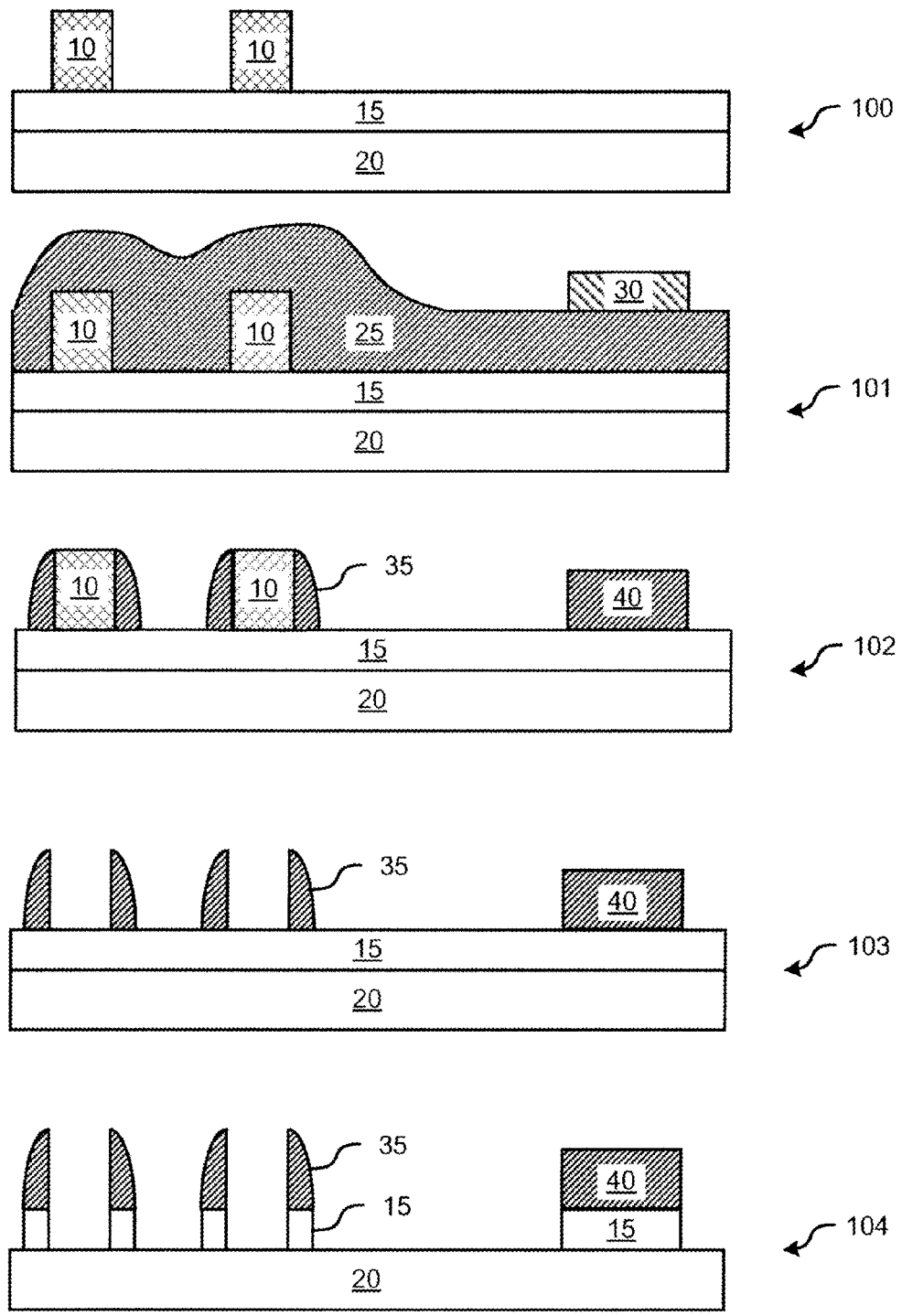
FIG. 1 is a diagram illustrating one example of spacer or self-aligned double patterning.
Figure 2:
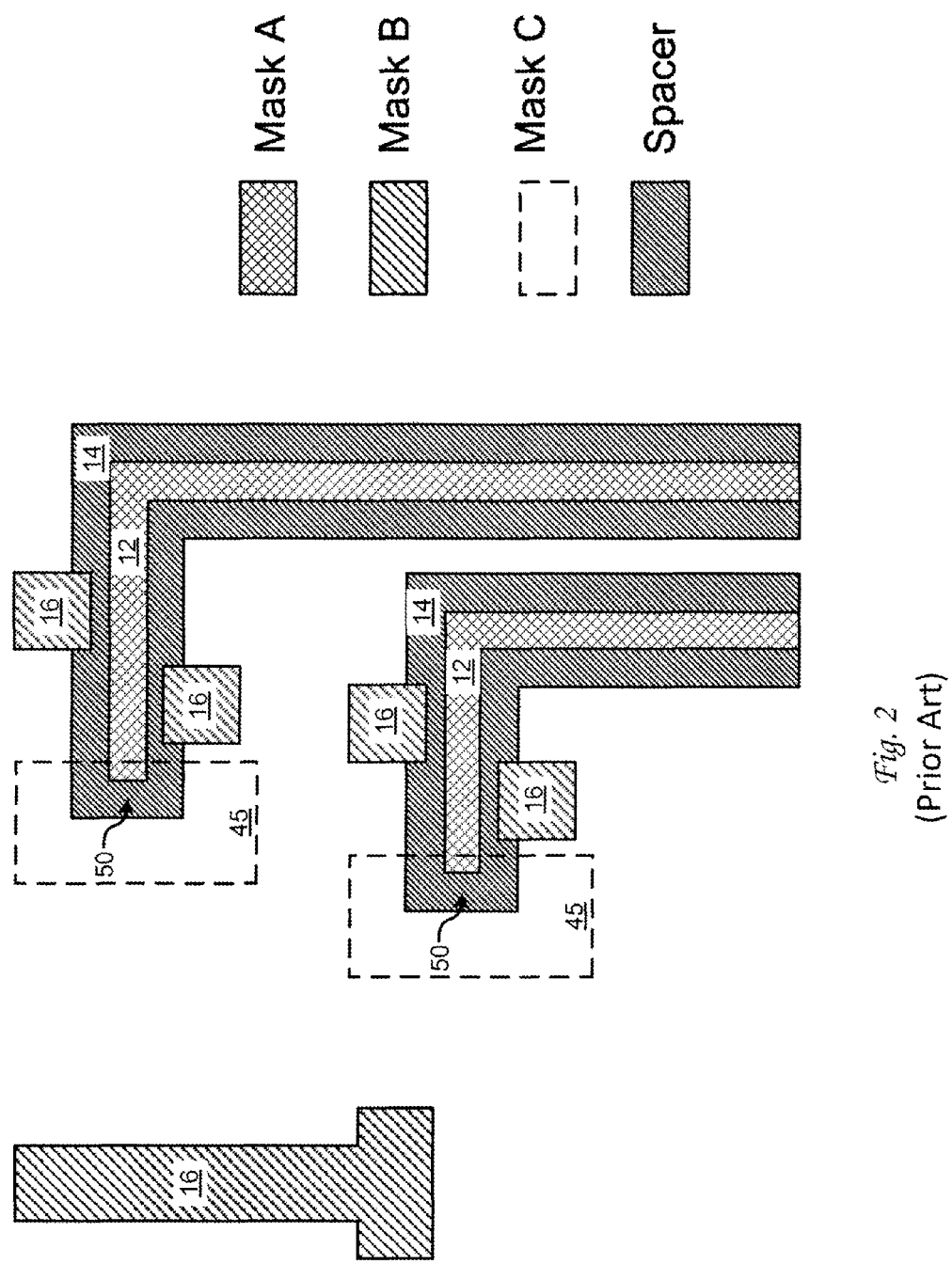
FIG. 2 is a diagram illustrating a top view of a self-aligned double patterning process and masks used to make the illustrated features.

Method 200 concludes by depositing and patterning a second material onto the substrate at operation 214. The second material typically comprises a photoresist material. In some embodiments, method 200 patterns the second material using a second photolithographic operation, resulting in a second pattern. The second pattern comprises the large features of the intended target layout (e.g. large features 102 illustrated in FIG. 1). In addition, the large features of the target layout have a width larger than the minimum critical dimension.

For the embodiment illustrated FIG. 4, the deposition and patterning of the second material at operation 214 occurs after selective removal of spacer material in operation 212. However, in some alternative embodiments of the invention, the deposition and patterning of the second material at operation 214 occurs after depositing the spacer material of operation 206, but before spacer-etch process of operation 208.

Figure 5:
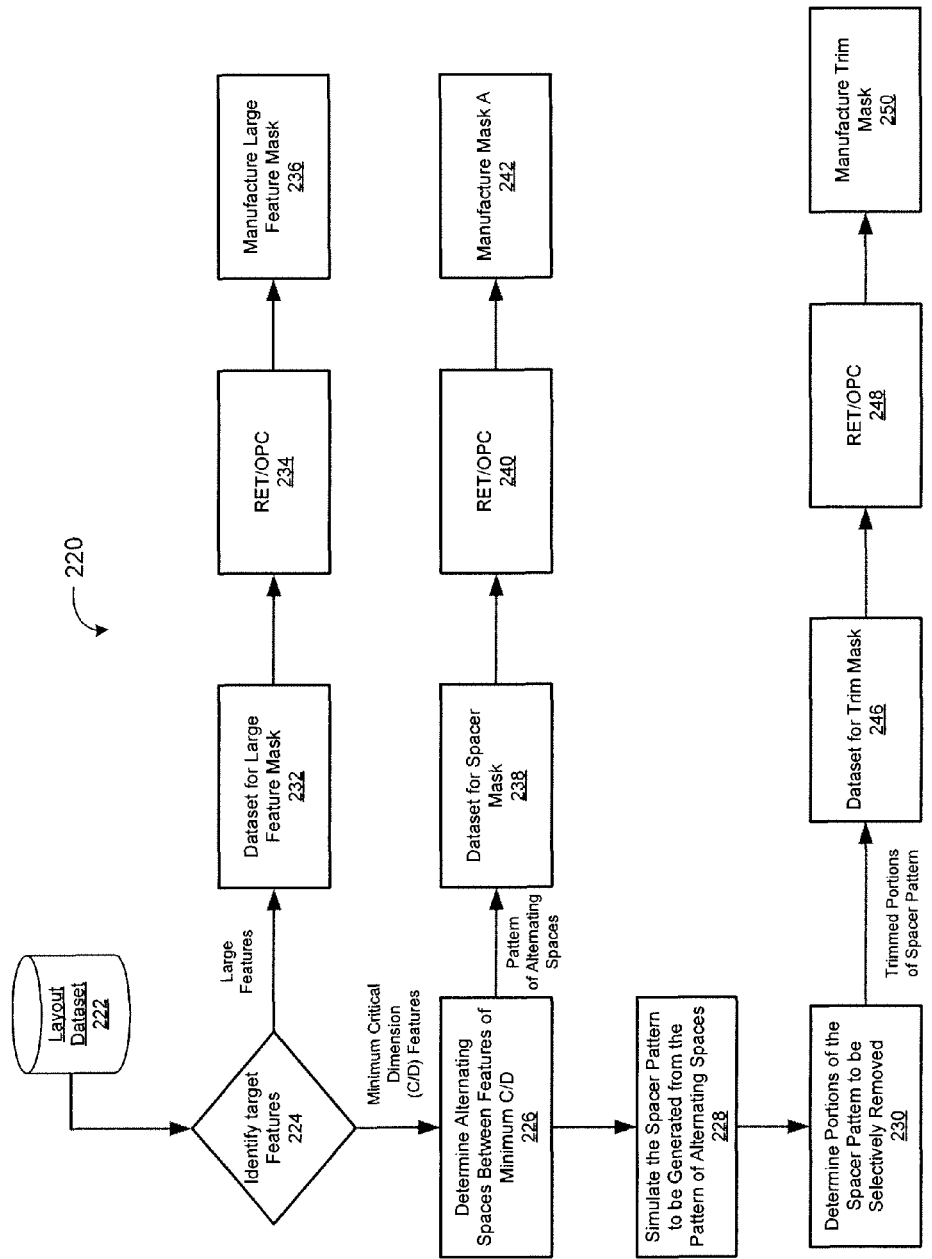
FIG. 5 is an operational flow diagram illustrating an example method of generating photomask datasets in accordance with one embodiment of the invention.

FIG. 5 is an operational flow diagram illustrating an example method 220 of generating photomask datasets in accordance with one embodiment of the invention. In particular, method 220 demonstrates and example of how a set of three photomasks can be manufactured from three datasets generated by an embodiment of the invention. The three photomasks can be used to pattern a target layout of line features and large features in accordance with embodiments of the invention. Referring now to FIG. 5, method 220 begins by receiving a layout dataset 222, which represents the features of a given circuit design. The circuit design comprises a target layout of line features and large features that are to be patterned onto the substrate. From the layout dataset 222, method 220 identifies the line features (e.g. line features 104) and large features (e.g. large features 102) of the target layout at operation 224. The line features identified at operation 224 are of minimum critical dimension, preventing such line features from being reliably patterned using an available photolithographic patterning process.

For the large features of the target layout, the example method 220 generates a dataset for a large feature mask at operation 232. Method 220 applies a resolution enhancement technique (RET) process, such as optical proximity correction (OPC), on the dataset at operation 234. RET and OPC processes are well known to those skilled in the art, and conventional RET and OPC processes can be used. The resulting modified dataset is manufactured into a large feature mask at operation 236.

For the minimum critical dimension (C/D) features of the target layout (e.g. the line features 104), method 220 determines the alternative spaces between the minimum critical dimension features at operation 226. In some embodiments, the pattern formed by the alternating spaces is utilized in operation 238 to generate a feature pattern that coincides with the pattern of alternating spaces. This feature pattern, in turn, is converted into a dataset for a spacer mask. Subsequently the dataset is processed through a RET process, such as OPC, at operation 240 and manufactured into a spacer mask at operation 242.

In order to trim sidewall spacer features into the line features (i.e. critical dimension features) of the intended target layout, operation 228 simulates a sidewall spacer pattern. In one embodiment, the sidewall spacer pattern is based on a simulated feature pattern that matches the alternating space pattern determined in operation 226. In particular, the simulation determines the sidewall spacer pattern (i.e. spacer pattern) that would result if self-aligned double patterning were performed on a feature pattern that matched the alternating space pattern determined in operation 226.

Subsequently, at operation 230, method 220 determines the portions of the simulated spacer pattern of operation 228 that need to be removed in order for the simulated spacer pattern to match the line features of the target layout. The line features (i.e. critical dimension features) of the target layout are formed by trimming the sidewall spacer features. Accordingly, upon determining the portions (or sections) of the spacer pattern to be removed at operation 228, operation 230 generates a dataset for a trim mask, according to those portions.

FIGS. 6-12 illustrate an example of patterning the gate layer of FIG. 3 as a target layout in accordance with one embodiment of the invention. Accordingly, the FIGS. 6-12 are now described with respect to the example methods described in FIG. 4 and FIG. 5.

Figure 6:
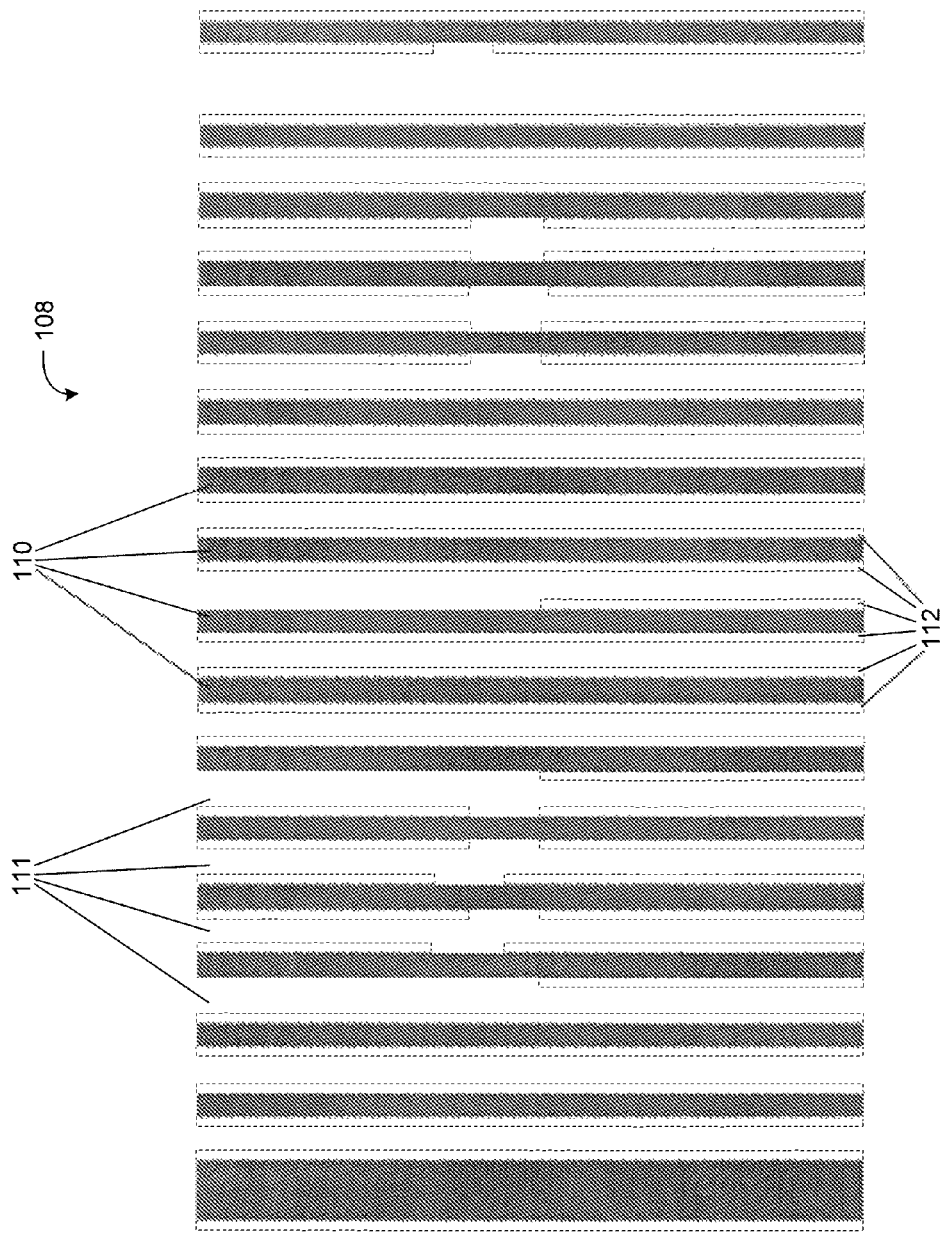
FIG. 6 is a diagram illustrating an example photomask pattern created in accordance with one embodiment of the invention.

FIG. 6 is a diagram illustrating an example photomask pattern created in accordance with one embodiment of the invention. Specifically, FIG. 6 illustrates a spacer photomask 108 as created by method 220 for the example gate layer illustrated in FIG. 3. The features 110 of spacer photomask 108 coincide with the alternating spaces determined in operation 226 of method 220. These features 110 are used to pattern the sacrificial layer on the substrate. Line features 112, which are not part of spacer photomask 108, are provided to illustrate how the sacrificial layer pattern created by mask features 110 assist in creating the line features 104 of the target layout. Note, in the alternative, alternating spaces 111 could have been chosen at operation 226, resulting in the features of spacer photomask 108 coinciding with alternating spaces 111.

Figure 7:
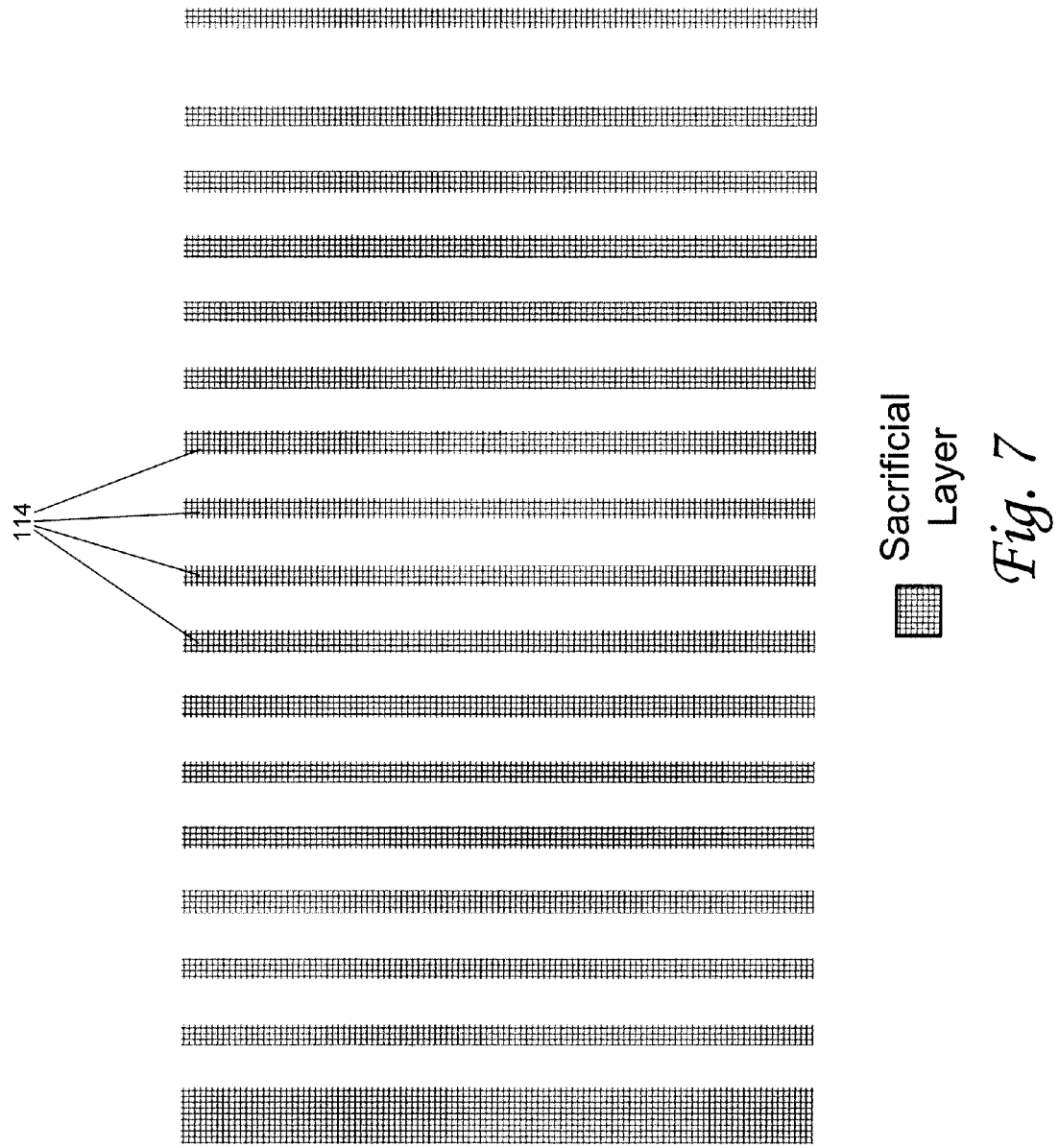
FIG. 7 is a diagram illustrating an example pattern created using sacrificial material in accordance with one embodiment of the invention.

FIG. 7 is a diagram illustrating an example pattern of sacrificial material created using spacer photomask 108 in accordance with one embodiment of the invention. In particular, the illustrated pattern 114 results from depositing and patterning sacrificial material (i.e. first material) in accordance with operation 204 of method 200. The sacrificial material is patterned using the photomask illustrated in FIG. 6 (i.e. mask 108), which can be created by method 220.

Figure 8:
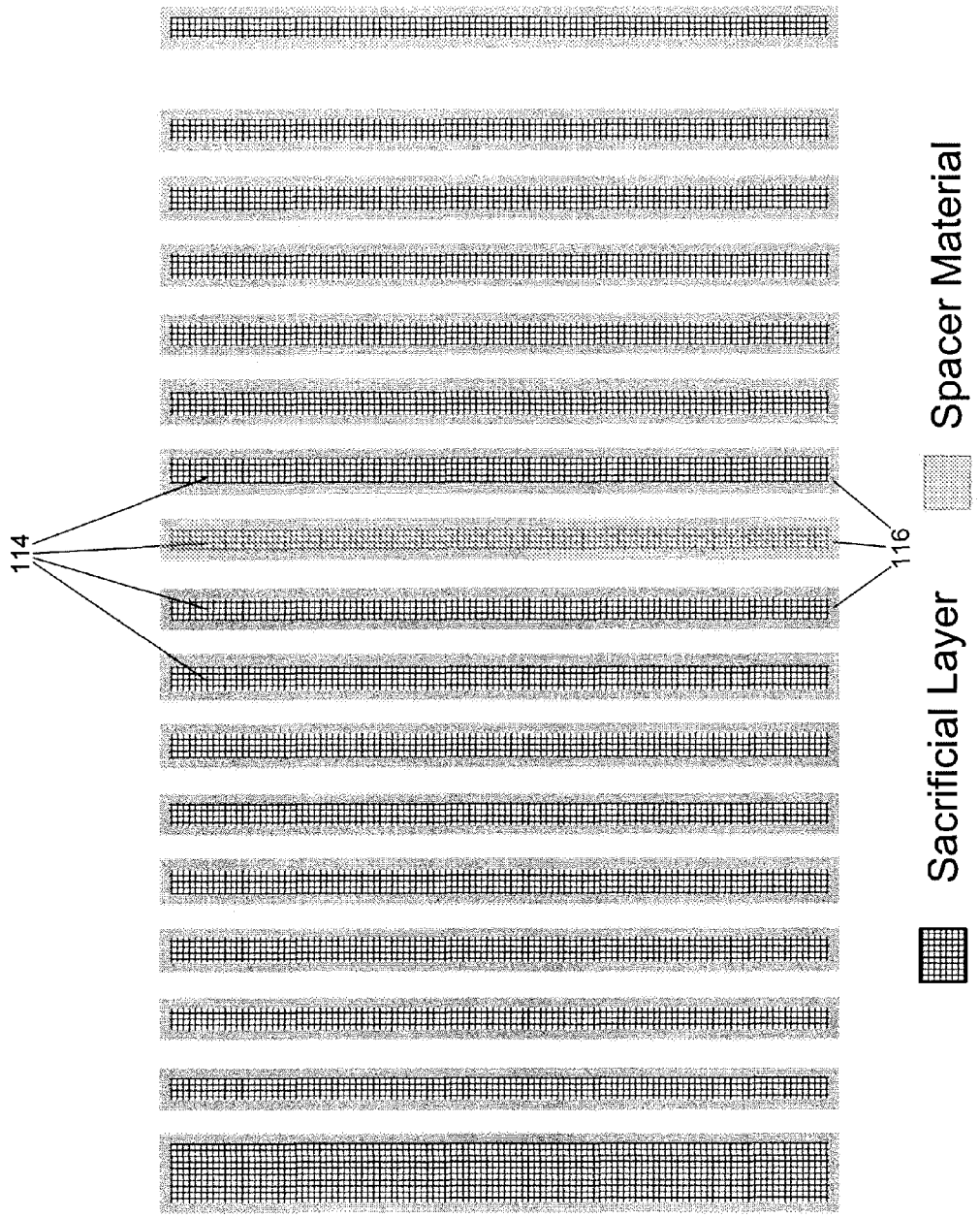
FIG. 8 is a diagram illustrating an example pattern created using spacer material in accordance with one embodiment of the invention.

FIG. 8 is a diagram illustrating the example spacer pattern that results from spacer deposition and etch using the sacrificial layer 114 illustrated in FIG. 7. The spacer material pattern 116 is formed by depositing spacer material over the substrate with sacrificial pattern 114 and then selectively etching the spacer material so that it remains adjacent sidewalls of sacrificial pattern 114. This can be done, for example, in accordance with operations 206 and 208 of method 200.

Figure 9:
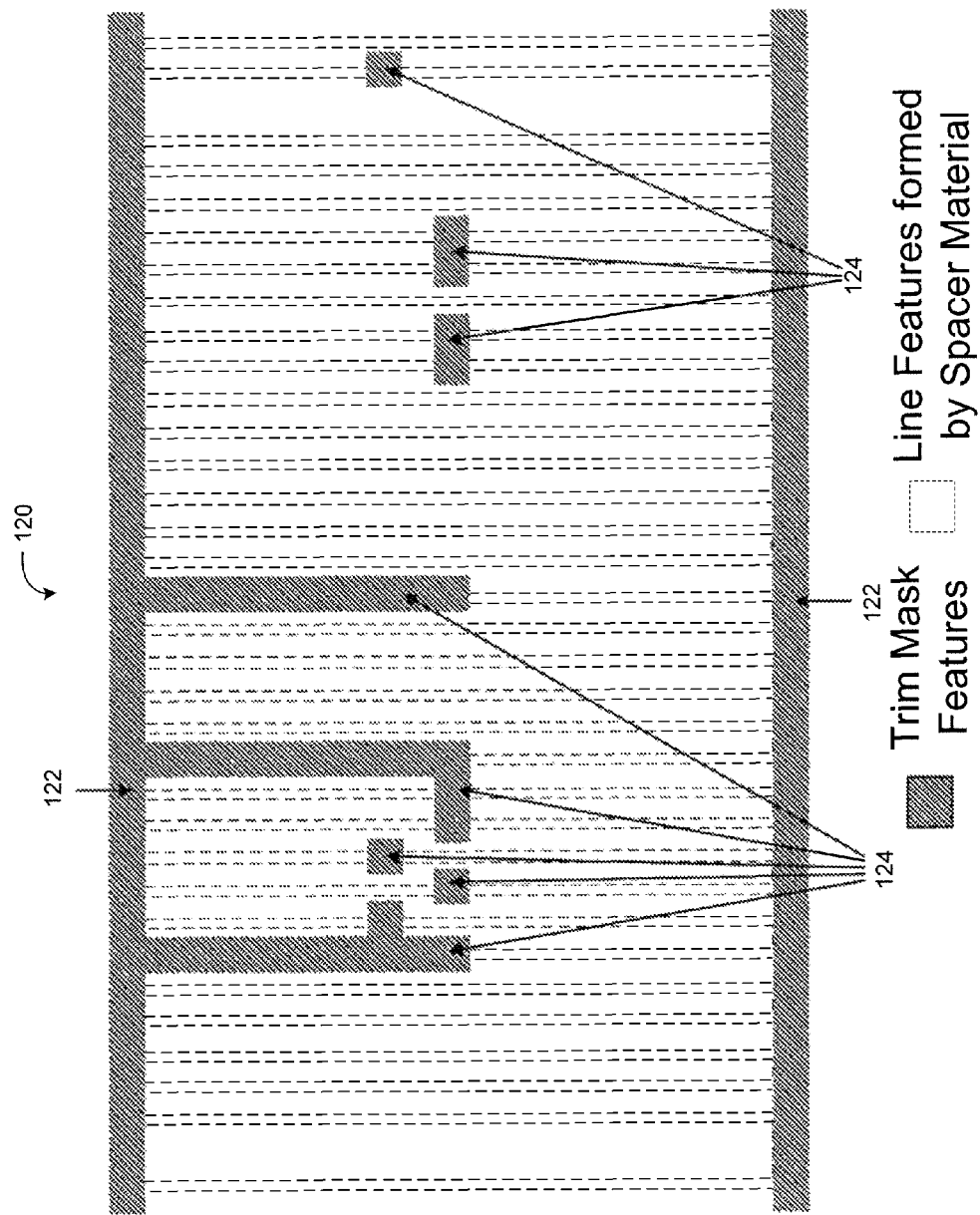
FIG. 9 is a diagram illustrating the use of an example photomask over spacer material in accordance with one embodiment of the invention.

FIG. 9 is a diagram illustrating an example of using a photomask and lithography operation to trim spacer material in accordance with the above-described example. Specifically, FIG. 9 illustrates an example trim photomask 120 as created by method 220 for the example target layout illustrated in FIG. 3. The dashed lines are not part of trim photomask 120, but are illustrated to show the mask features in relation to underlying spacer pattern 116 shown in FIG. 8. Photomask features 122 are used during lithography to trim the undesired portions of spacer pattern 116. For example, unwanted shorts or other unwanted connections can be trimmed using this trim mask 120. Photomask features 124 trim the portion of the spacer pattern 116 such that the resulting trimmed spacer pattern (pattern 130 illustrated in FIG. 10, below) matches the pattern created by line features 104 of the target layout. Features 122 and features 124 of trim photomask 120 are determined during operation 230 of method 220.

Figure 10:
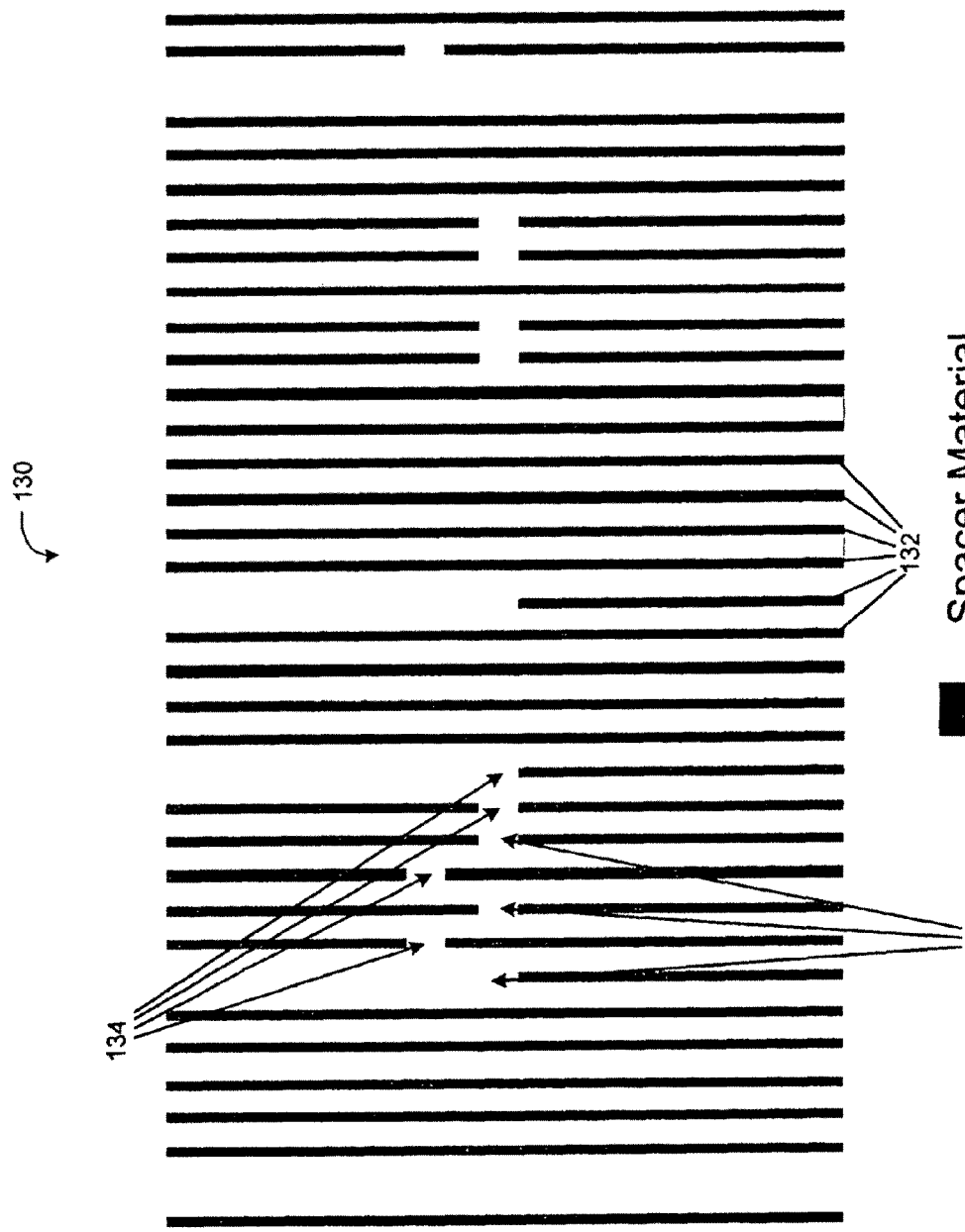
FIG. 10 is a diagram illustrating an example spacer material pattern remaining after use of a trim photomask in accordance with one embodiment of the invention.

FIG. 10 is a diagram illustrating an example of a spacer material pattern remaining after use of a trim photomask 120 in accordance with one embodiment of the invention. In particular, FIG. 10 illustrates the spacer material pattern 130 that results after the removal of sacrificial pattern 114 illustrated in FIG. 7, and after trimming the spacer at a 116 (FIG. 8) using trim ask 120 of FIG. 9. As this example illustrates, the spacer features 132 that remain are those defined by the dashed lines illustrated in FIG. 9. These correspond to the spacer material 116 of FIG. 8 that are not removed by the lithography operation using trim mask 120. The spaces 134 where spacer material 116 is removed, are spaces created by the trim operation. As this example illustrates, these spaces 132 correspond to features 124 of the trim photomask 120. Removal of the sacrificial material and the spacer trim correspond to operations 210 and 212 of method 200, respectively.

Figure 11:
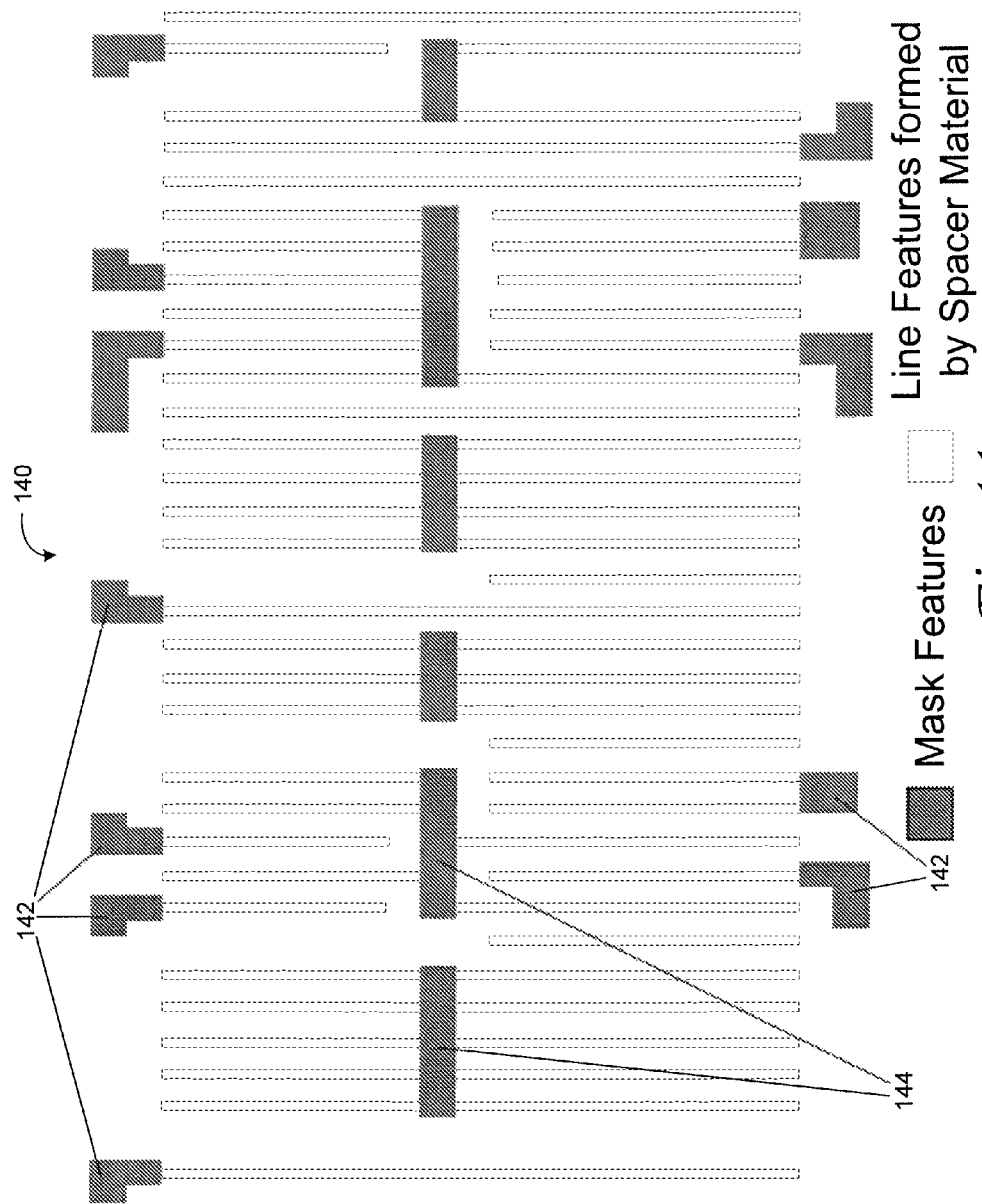
FIG. 11 is a diagram illustrating an example photomask for patterning large features in accordance in accordance with one embodiment of the invention.

FIG. 11 is a diagram illustrating an example photomask for patterning large features in accordance with one embodiment of the invention. Specifically, FIG. 11 illustrates an example large feature mask 140 that can be created by method 220 for the example target layout illustrated in FIG. 3. Large feature mask 140 is utilized to pattern large features 102 of the target layout. The large features 102 can be patterned during lithography with mask features 142 and 144 of large feature mask 140. Large features 142 exemplify pad features, while large features 144 exemplify gate interconnect features. Patterning the large features can be done in accordance with operation 224 of method 220

Figure 12:
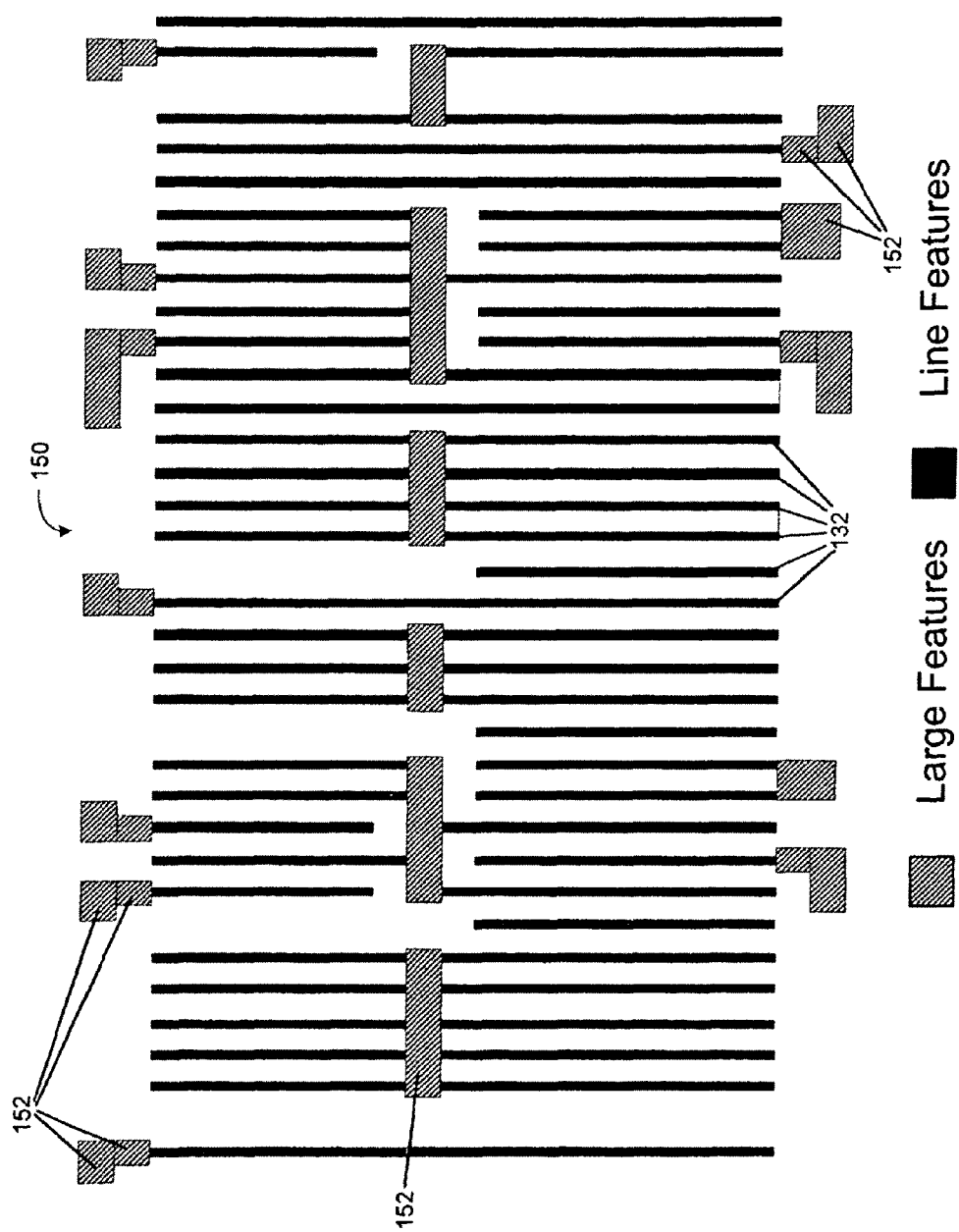
FIG. 12 is a diagram illustrating an example pattern of line features and large features as created in accordance with one embodiment of the invention.

FIG. 12 is a diagram illustrating a pattern of line features and large features as created in accordance with the example masks described above in FIGS. 6-11. As described above, line patterns 132 are created using a spacer double patterning operation with spacer photomask 108 and trim mask 120. The larger line features 132 and large features 152 result after operation 214 of method 200, where a photoresist material is deposited over spacer pattern 130 and patterned using photomask 140. This example pattern 150 corresponds to the target layout for the gate layer illustrated in FIG. 3.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed or deposited thereon.

The teen tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 13:
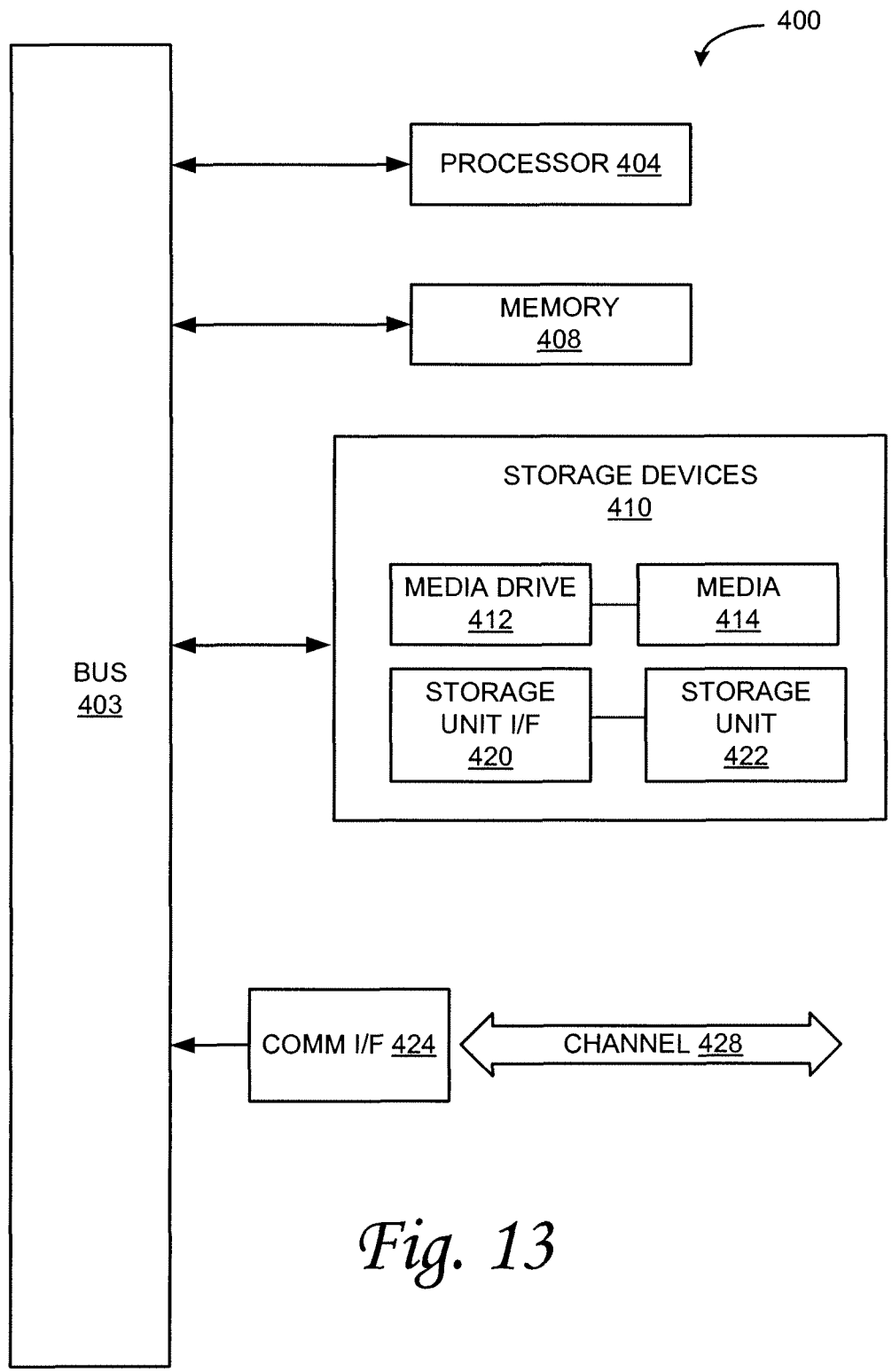
FIG. 13 is a simplified block diagram illustrating an example-computing module in accordance with one embodiment of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 13. Various embodiments are described in terms of this example-computing module 400. After reading this description, it will become apparent to a person skilled in the relevant art how to implement the invention using other computing modules or architectures.

Referring now to FIG. 13, computing module 400 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 400 might also represent computing capabilities embedded within or otherwise available to a given device. For example, a computing module might be found in other electronic devices. Computing module 400 might include, for example, one or more processors or processing devices, such as a processor 404. Processor 404 might be implemented using a general-purpose or special-purpose processing engine such as, for example, a microprocessor, controller, or other control logic.

Computing module 400 might also include one or more memory modules, referred to as main memory 408. For example, random access memory (RAM) or other dynamic memory might be used for storing information and instructions to be executed by processor 404. Main memory 408 might also be used for storing temporary variables or other intermediate information during execution of instructions by processor 404. Computing module 400 might likewise include a read only memory ("ROM") or other static storage device coupled to bus 402 for storing static information and instructions for processor 404.

The computing module 400 might also include one or more various forms of information storage mechanism 410, which might include, for example, a media drive 412 and a storage unit interface 420. The media drive 412 might include a drive or other mechanism to support fixed or removable storage media 414. For example, a hard disk drive, a floppy disk drive, a magnetic tape drive, an optical disk drive, a CD or DVD drive (R or RW), or other removable or fixed media drive. Accordingly, storage media 414 might include, for example, a hard disk, a floppy disk, magnetic tape, cartridge, optical disk, a CD or DVD, or other fixed or removable medium that is read by, written to or accessed by media drive 412. As these examples illustrate, the storage media 414 can include a computer usable storage medium having stored therein particular computer software or data.

In alternative embodiments, information storage mechanism 410 might include other similar instrumentalities for allowing computer programs or other instructions or data to be loaded into computing module 400. Such instrumentalities might include, for example, a fixed or removable storage unit 422 and an interface 420. Examples of such storage units 422 and interfaces 420 can include a program cartridge and cartridge interface, a removable memory (for example, a flash memory or other removable memory module) and memory slot, a PCMCIA slot and card, and other fixed or removable storage units 422 and interfaces 420 that allow software and data to be transferred from the storage unit 422 to computing module 400.

Computing module 400 might also include a communications interface 424. Communications interface 4Z24 might be used to allow software and data to be transferred between computing module 400 and external devices. Examples of communications interface 424 might include a modem or softmodem, a network interface such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 424 might typically be carried on signals, which can be electronic, electromagnetic (which includes optical) or other signals capable of being exchanged by a given communications interface 424. These signals might be provided to communications interface 424 via a channel 428. This channel 428 might carry signals and might be implemented using a wired or wireless communication medium. These signals can deliver the software and data from memory or other storage medium in one computing system to memory or other storage medium in computing system 400. Some examples of a channel might include a phone line, a cellular link, an RF link, an optical link, a network interface, a local or wide area network, and other wired or wireless communications channels Computing module 400 might also include a communications interface 424. Communications interface 424 might be used to allow software and data to be transferred between computing module 400 and external devices. Examples of communications interface 424 might include a modem or softmodem, a network interface such as an Ethernet, network interface card, WiMAX, 802.XX or other interface), a communications port (such as for example, a USB port, IR port, RS232 port, Bluetooth interface, or other port), or other communications interface. Software and data transferred via communications interface 424 might typically be carried on signals, which can be electronic, electromagnetic, optical or other signals capable of being exchanged by a given communications interface 424. These signals might be provided to communications interface 424 via a channel 428. This channel 428 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 408, storage unit 420, and media 414. These and other various forms of computer program media or computer usable media may be involved in storing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 400 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What we claim is:

1. A method of semiconductor device fabrication for patterning a target layout of line features and large features comprising:
    depositing a first layer of a first material and patterning the first layer to form a first pattern on a substrate, wherein the first pattern comprises first array of line features;
    depositing a spacer material over the first pattern on the substrate;
    etching the spacer material such that spacer material is removed from horizontal surfaces of the substrate and the first pattern but remains adjacent to vertical surfaces of the first pattern;
    removing the first pattern from the substrate;
    selectively removing the spacer material, such that the spacer material that remains forms a spacer material pattern comprising the line features of the target layout; and
    depositing a second layer of a second material over the spacer material pattern and patterning the second layer to form a second pattern, wherein the second pattern is different from the first pattern and comprises the larger features of the target layout.

2. The method of claim 1, wherein the target layout has a density of line features double that of the first array.

3. The method of claim 1, wherein the line features within the target layout are narrower than a minimum critical dimension that can be produced with a photolithographic patterning process.

4. The method of claim 3, wherein the large features of the target layout are wider than the minimum critical dimension that can be produced with a photolithographic process.

5. The method of claim 1, wherein the first layer and second layer combined from a gate of the circuit design.

6. The method of claim 1, wherein the large features of the target layout include connections features, pad features and logic devices.

7. The method of claim 1, wherein depositing and patterning the second layer occurs after depositing the spacer material and before etching the spacer material.

8. The method of claim 1, wherein depositing and patterning the second layer occurs after removing the first pattern from the substrate.

9. The method of claim 1, wherein selectively removing the spacer material involves using a photomask to remove certain portions of the spacer material.

10. The method of claim 1, wherein patterning the first layer and the second layer involves using a photomask.

* * * * *